United States Patent
Shu et al.

[11] Patent Number: 5,972,803
[45] Date of Patent: Oct. 26, 1999

[54] HIGH THROUGHPUT OPTICAL CURING PROCESS FOR SEMICONDUCTOR DEVICE MANUFACTURING

[75] Inventors: Jing Shing Shu; Ming-Jang Hwang, both of Richardson, Tex.; Mehrdad M. Moslehi, Los Altos, Calif.; Cecil J. Davis, Greenville, Tex.

[73] Assignee: Texas Instruments Incorporated, Dallas, Tex.

[21] Appl. No.: 08/955,422

[22] Filed: Oct. 22, 1997

Related U.S. Application Data

[63] Continuation of application No. 08/748,525, Nov. 8, 1996, abandoned, which is a continuation of application No. 08/230,353, Apr. 20, 1994, abandoned.

[51] Int. Cl.[6] .......................... H01L 21/469; H01L 21/02
[52] U.S. Cl. ............................................. 438/781; 438/761
[58] Field of Search ..................... 438/781, 760, 438/761

[56] References Cited

U.S. PATENT DOCUMENTS

| | | | |
|---|---|---|---|
| 4,385,344 | 5/1983 | Gonser | 362/293 |
| 4,461,670 | 7/1984 | Celler et al. | 117/54 |
| 4,510,173 | 4/1985 | Higashikawa et al. | |
| 4,782,380 | 11/1988 | Shankar et al. | 438/627 |
| 4,830,700 | 5/1989 | Davis et al. | 156/345 |
| 4,832,777 | 5/1989 | Davis et al. | 156/345 |
| 4,842,686 | 6/1989 | Davis et al. | 438/709 |
| 4,983,546 | 1/1991 | Hyun et al. | 437/231 |
| 5,024,969 | 6/1991 | Reche | 438/623 |
| 5,059,448 | 10/1991 | Chandra et al. | 437/235 |
| 5,192,715 | 3/1993 | Sliwa et al. | 438/631 |
| 5,236,551 | 8/1993 | Pan | 438/622 |
| 5,248,636 | 9/1993 | Davis et al. | 438/709 |
| 5,254,497 | 10/1993 | Ciu et al. | 438/384 |
| 5,270,259 | 12/1993 | Ito et al. | 438/623 |
| 5,376,586 | 12/1994 | Beilin et al. | 438/623 |
| 5,393,703 | 2/1995 | Yang et al. | 438/628 |
| 5,438,022 | 8/1995 | Allman et al. | 438/763 |
| 5,458,912 | 10/1995 | Camelletti et al. | 427/387 |
| 5,476,817 | 12/1995 | Numata | 438/619 |
| 5,514,616 | 5/1996 | Rostoker et al. | 438/228 |

FOREIGN PATENT DOCUMENTS

| | | |
|---|---|---|
| 0462715A1 | 12/1991 | European Pat. Off. . |
| 0637072A2 | 2/1995 | European Pat. Off. . |
| 01248528 | 10/1989 | Japan . |
| 06021241 | 1/1994 | Japan . |

OTHER PUBLICATIONS

Rudolf Buchta, Dag Sigurd and Peter Revell; "Making Waves With Microwaves" Rapid Thermal Processing—vol. 14, No. 1, Jan. 1992.

*Primary Examiner*—Savitri Mulpuri
*Attorney, Agent, or Firm*—Mark A. Valetti; Carlton H. Hoel; Richard L. Donaldson

[57] ABSTRACT

This is a curing method of low-k dielectric material in a semiconductor device and system for such. The method may comprise: depositing metal interconnection lines; depositing the low-k dielectric material layer over the lines; and curing the low-k dielectric material layer with a heating lamp for less than 10 minutes, wherein the heating lamp provides optical radiation energy in the infrared spectral range of about 1 micron to 3.5 microns in wavelength. The heating lamp may be a tungsten-halogen lamp.

15 Claims, 1 Drawing Sheet

HIGH THROUGHPUT OPTICAL CURING PROCESS FOR SEMICONDUCTOR DEVICE MANUFACTURING

This application is a Continuation of application Ser. No. 08/748,525 filed on Nov. 08, 1996, now abandoned, which is a Continuation of prior application Ser. No. 08/230,353, filed on Apr. 20, 1994, now abandoned.

FIELD OF THE INVENTION

This invention relates to semiconductor device manufacturing, and specifically to the curing process of semiconductor device manufacturing.

BACKGROUND OF THE INVENTION

Semiconductors are widely used in integrated circuits for electronic applications, including radios and televisions. Many integrated circuits now contain multiple levels of metallization for interconnections. A single semiconductor microchip may have thousands, and even millions of transistors. Logically, a single microchip may also have millions of lines interconnecting the transistors. These lines create a potential for electrical capacitance to gather in between the lines. As device geometries shrink and functional density increases, it becomes imperative to reduce the capacitance between the lines. If line-to-line capacitance builds up, a potential for electrical inefficiencies and inaccuracies exist. Reducing the RC time constant within these multi-level metallization systems will reduce the capacitance between the lines.

A method of reducing the RC time constant within these multi-level systems is the utilization of materials with low dielectric constants in the fabrication process. Conventional semiconductor fabrication uses silicon dioxide or similar insulating materials as both a gap filler between adjacent conductors at the same level and as an interlayer insulator. Silicon dioxide has a dielectric constant of about 3.9. This constant is based on a scale where 1.0 represents the dielectric constant of a vacuum. Various materials exhibit dielectric constants from very near 1.0 to values in the hundreds. As used herein, the term low-k will refer to a material with a dielectric constant less than 3.0.

Polymeric spin-on glass, polyimide, and various polymer low-k materials have been used in multilevel interconnect fabrication processes. The applications of these materials include low-k interlevel dielectric, dielectric gap fill, and local planarization. The conventional fabrication processes rely on thermal curing process after the material layer deposition to form a stable solid layer. However, the thermal curing process has been performed at 400–500 degrees Celsius.

In addition, the conventional method of manufacturing semiconductor devices has been by batch production. In contrast, only recently, have attempts focused on single wafer and continuous assembly line wafer manufacturing.

SUMMARY OF THE INVENTION

It has now been found that such conventional curing processes have shortcomings. For example, the conventional curing temperatures may cause electromigration and stress-induced reliability problems in aluminum-based multilevel interconnects. Moreover, the current practice requires many hours of curing time at high temperatures, resulting in low process throughputs.

The present invention uses heat sources of various wavelengths to cure low-k dielectrics and protective overcoats at lower temperatures, faster cycle times and lower scrap rates then the conventional furnace processes. For example, it takes 10 hours to cure 150 wafers of 16 megabit DRAM at polyimide protective coat at a conventional wafer fabrication facility. When the furnace malfunctions, the entire 150 wafers must be scrapped. However, by using tungsten-halogen lamps and single wafer processing equipment, reduction in cycle time and scrap is expected, due to the photo-enhanced curing effect. The present invention can also apply conventional interlevel dielectrics processing, such as curing of polymeric spin-on glass (e.g. organic containing spin-on glass).

This is a curing method of low-k dielectric material in a semiconductor device and system for such. The method may comprise: depositing metal interconnection lines; depositing the low-k dielectric material layer over the lines; and optically curing the low-k dielectric material layer with a heating lamp for less than 10 minutes, wherein the heating lamp provides optical radiation energy in the infrared spectral range of about 1 micron to 3.5 microns in wavelength. The heating lamp may be a tungsten-halogen lamp.

BRIEF DESCRIPTION OF THE DRAWINGS

This invention can be best understood by reference to the following drawing(s), in which.

DESCRIPTION OF THE PREFERRED EMBODIMENTS

In one embodiment, this invention provides a method of lamp-heated rapid thermal processing for rapid photo-enhanced thermal curing process for material layers. For example, polymeric spin-on glass, polyimide and other organic material layers may be cured. The use of lamp heating can reduce the curing time and temperature due to the selective optical power absorption in the spin-on material layer. These materials usually have strong absorption lines in the near infrared portion of the spectrum. Various types of heating lamps may be used. For example, tungsten-halogen lamps provide most of the optical radiation energy for the IR spectral range of about 1 micron to 3.5 microns in wavelength. This selective photoabsorption and photo-enhanced curing effect allows lower substrate temperatures, hence improved metal interconnect reliability and increased curing process throughput. The curing process may be performed in any commercially available rapid thermal processing (RTP) equipment.

Figure 1:
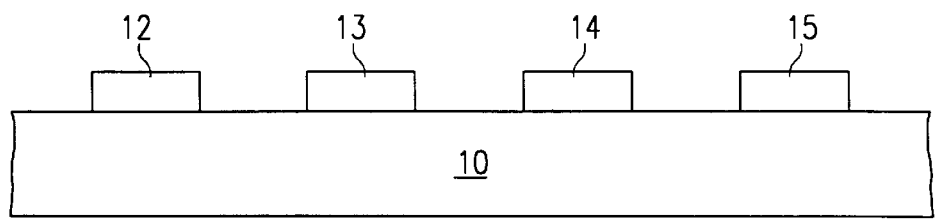
FIGS. 1–5 are cross-sections of semiconductor device under different stages of the preferred embodiment.

FIGS. 1–5 are successive stages in an example implementation of the invention. FIG. 1 shows an insulator layer 10 with metal interconnection lines 12–15. The metal interconnection lines 12–15 can be fabricated using conventional methods.

Figure 2:
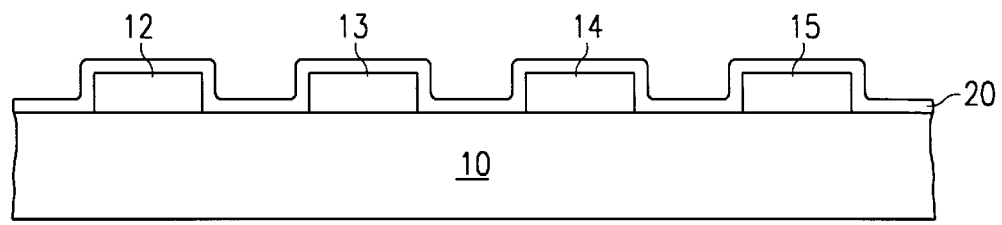

FIG. 2 shows the insulator layer 10 and the interconnection lines 12–15 topped by a liner 20 used as a diffusion barrier or an adhesion layer. The liner 20 may be deposited and may be made of titanium, tantalum, titanium nitride or other materials that would act as good diffusion layer or an adhesion layer.

Figure 3:
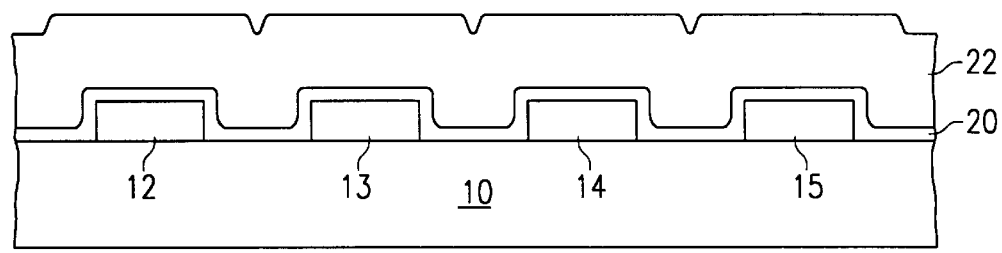

FIG. 3 shows a low-k dielectric layer 22 above the liner 20, the interconnection lines, and the insulator layer 10. Generally, low-k dielectric layers are spun on, but any deposition method will be adequate. After deposition of the low-k dielectric layer 20, the layer would then be cured using a tungsten-halogen lamp for less than 10 minutes (e.g.

for polyimide, the curing time for a tungsten-halogen lamp is about 3–5 minutes).

Figure 4:
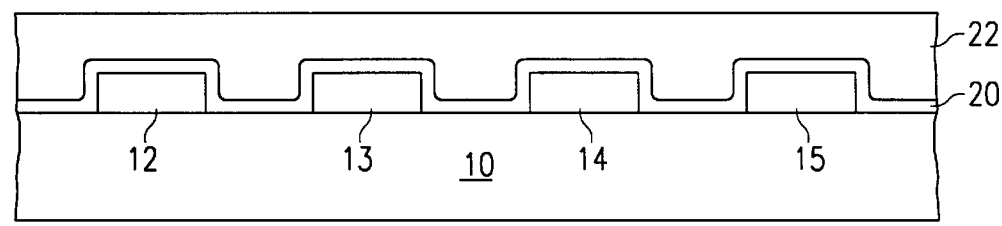

FIG. 4 shows the low-k dielectric layer 22 after it has been planarized. The planarization is optional, but would produce a smoother surface for successive materials.

Figure 5:
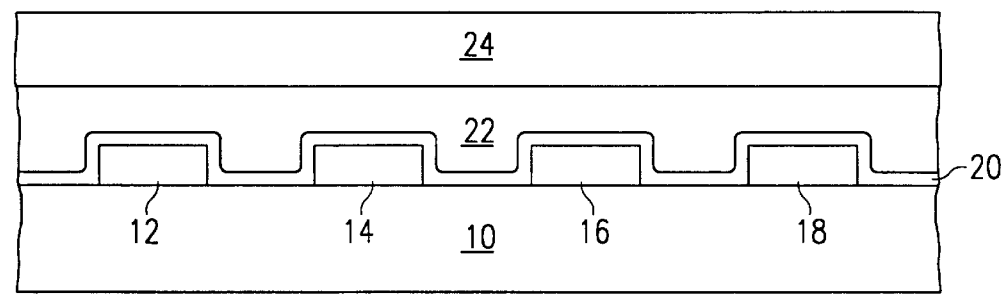

FIG. 5 shows a second low-k dielectric layer 24 on top of the first low-k dielectric layer 22. The second low-k dielectric layer 24 is used to protect the first layer 22 and completes the interconnection structure. The second dielectric layer is optional also. The second dielectric layer would then be cured using a tungsten-halogen lamp for less than 10 minutes (e.g. as before, the if the second layer was a polyimide, the curing time for a tungsten-halogen lamp would be from 3–5 minutes).

The invention is not to be construed as limited to the particular examples described herein, as these are to be regarded as illustrative, rather than restrictive. The invention is intended to cover all processes for various material layers which do not depart from the spirit and scope of the invention. Of course, any organic or inorganic low-k material could be used as either layer in the device. For example, polymeric spin-on glass, polyimide, silicon dioxide, and zinc oxide are a few low-k materials which could be used in the invention. In addition to tungsten-halogen lamps, other heating sources that provide the specific optical response to cure the low-k material could be used. Furthermore, the liner on top of the metal interconnection lines is optional. The invention may also be used in other areas of semiconductor manufacturing where low-k materials are used. For example, at the poly-metal-dielectric (PMD) level, low-k materials may be used as gap fillers between polysilicon interconnection layers and in open areas between transistors and other electronic devices. Other modifications and combinations will be apparent to those skilled in the art. It is therefore intended that the appended claims encompass any such modifications or embodiments.

We claim:

1. A method of rapidly curing material layers in a semiconductor device, said method consisting of the steps of:

providing a semiconductor layer over a substrate;

depositing a liner above said semiconductor layer;

depositing a low-k dielectric material layer over said liner, said low-k dielectric material having a dielectric constant of less than 3.0; and rapidly curing said low-k dielectric material layer using Rapid Thermal Processing (RTP) equipment, said RTP equipment comprising a heating lamp;

wherein said curing step is less than 10 minutes, wherein said heating lamp provides optical radiation energy in the infrared spectral range of about 1 micron to 3.5 microns in wavelength, and wherein said heating lamp provides substantially all required curing for said low-k material layer.

2. The method of claim 1, wherein said low-k material is polymeric spin-on glass.

3. The method of claim 1, wherein said low-k material is a polyimide and said curing time is less than 5 minutes.

4. The method of claim 1, wherein said low-k material is composed of organic compounds.

5. The method of claim 1, wherein said method further includes single wafer processing.

6. The method of claim 1, wherein said method further includes single wafer processing in an assembly line process.

7. The method of claim 1, wherein said curing of said low-k material is done by a tungsten-halogen lamp.

8. The method of claim 1, wherein said method further includes depositing a protective layer over said low-k dielectric material layer before said curing.

9. The method of claim 1, wherein said method further includes depositing a second low-k dielectric material over said low-k dielectric material layer before said curing, wherein said second low-k dielectric material has a dielectric constant of less than 3.0.

10. A method of rapidly curing a low-k dielectric material layer in a semiconductor device, said method consisting of the steps of:

providing a semiconductor layer over a substrate;

depositing metal interconnection lines over said semiconductor layer;

depositing a liner over said semiconductor layer and said metal interconnection lines;

depositing a low-k dielectric material layer over said liner, said low-k dielectric material having a dielectric constant of less than 3.0; and rapidly curing said low-k dielectric material layer using Rapid Thermal Processing (RTP) equipment, said RTP equipment comprising a heating lamp;

wherein said curing step is less than 10 minutes, wherein said heating lamp provides optical radiation energy in the infrared spectral range of about 1 micron to 3.5 microns in wavelength, and wherein said heating lamp provides substantially all required curing for said low-k material layer.

11. The method of claim 10, wherein said curing of said low-k material is done by a tungsten-halogen lamp.

12. The method of claim 1, wherein said depositing said liner includes depositing a metal.

13. The method of claim 1, wherein said depositing said liner includes depositing a material selected from the group consisting of titanium, tantalum, and titanium nitride.

14. The method of claim 10, wherein said depositing said liner includes depositing a metal.

15. The method of claim 10, wherein said depositing said liner includes depositing a material selected from the group consisting of titanium, tantalum, and titanium nitride.

* * * * *